United States Patent
Yeom et al.

[19]

[11] Patent Number: 6,066,540
[45] Date of Patent: May 23, 2000

[54] METHOD FOR MANUFACTURING A CAPACITOR OF A SEMICONDUCTOR DEVICE

[75] Inventors: Seung Jin Yeom; Young Jin Park, both of Kyoungki-do, Rep. of Korea

[73] Assignee: Hyundai Electronics Industries Co., Ltd., Ichon-shi, Rep. of Korea

[21] Appl. No.: 09/143,096

[22] Filed: Aug. 28, 1998

[30] Foreign Application Priority Data

Aug. 30, 1997 [KR] Rep. of Korea ........................ 97-44618

[51] Int. Cl.⁷ ...................................................... H01L 21/20
[52] U.S. Cl. ............................. 438/396; 438/3; 438/240; 438/643
[58] Field of Search .................... 438/396, 253, 438/254, 256, 397, 399, 643, 3, 240

[56] References Cited

U.S. PATENT DOCUMENTS 5,121,174   6/1992   Forgerson, II et al. .
5,670,808   9/1997   Nishihori et al. .
5,877,062   3/1999   Horii ........................................ 438/396
5,913,145   6/1999   Lu et al. .................................. 438/643

*Primary Examiner*—Tuan H. Nguyen
*Attorney, Agent, or Firm*—Jacobson, Price, Holman & Stern, PLLC

[57] ABSTRACT

A method for manufacturing a capacitor of semiconductor device is provided, which method has the steps of providing a semiconductor substrate; forming a intermediate insulating film having a contact plug on the semiconductor substrate; forming a tungsten nitride film as an diffusion barrier film on the intermediate insulating film including the contact plug; and forming a stack structure of a lower electrode, a dielectric layer and an upper electrode on the tungsten nitride film. So, the destruction of diffusion protection film due to the tension stress can be protected and the reaction of silicide between the electrode material and the contact plug which is a polysilicon can be controlled since the tungsten nitride film has an excellent diffusion protection property so that the property deterioration of the device can be protected, the characteristic and reliability of semiconductor device can be improved and then large scale integration of semiconductor device can be embodied.

17 Claims, 1 Drawing Sheet

METHOD FOR MANUFACTURING A CAPACITOR OF A SEMICONDUCTOR DEVICE

BACKGROUND OF INVENTION

1. Field of Invention

The present invention relates to a method for manufacturing a capacitor of a semiconductor device, and more particularly, to a method for manufacturing a capacitor of a semiconductor device, which is suitable for large scale integration of a semiconductor device by controlling the deterioration phenomenon of a diffusion barrier film caused by the thermal process which is a defect in the conventional art, and thus, improving the electrical characteristic of the capacitor.

2. Description of the Related Art

As a semiconductor device is integrated in large scale and the size of a cell is reduced, it becomes difficult to guarantee sufficient electrostatic capacity, which is proportional to the surface area of storage electrode.

In particular, in the DRAM device in which unit cell is composed of a MOS transistor and a capacitor, it becomes an important factor for integrating DRAM device in large scale to increase the electrostatic capacity of the capacitor which occupies most of the area on a chip and decrease the area simultaneously.

Therefore, in order to increase the electrostatic capacity of the capacitor, which is expressed as (Eo*Er*A)/T (here, Eo is permittivity of vacuum, Er is permittivity of dielectric film, A is an area of capacitor and T is a thickness of dielectric film), the surface area of a storage electrode, which is a lower electrode in a capacitor, is increased. However, it makes large scale integration difficult since the manufacturing process becomes complicated and the step coverage is increased.

Therefore, the dielectric film is formed out of ferroelectric such as Tantalum oxide film of high permittivity having high dielectric constant Er (Ta2O5), BST (Ba, Sr) film, PZT (PbZrTiO3) film, SBT (SrBi2Ta2O9) film or PLZT (PbLaZrTiO3) film, and the upper and lower electrodes are formed out of Platinum (Pt) or conductive oxide film.

Here, an anneal process of about 800° C. with which the dielectric film formation process accompanies needs a diffusion barrier film which protects the reaction between an electrode material and a polysilicon plug being a contact plug.

However, a diffusion barrier film used recently is formed as TiN/Ti stack structure, and it reacts with the silicon during the thermal process at a high temperature and then forms a titanium silicide. And the diffusion barrier film can be destroyed due to the high tension stress occurring at that moment.

Therefore, the reaction occurs between the electrode material and the silicon where it makes a silicide with high resistance and deteriorates the electric characteristic of a capacitor.

Also, in a case that a platinum is used as an electrode material, since an oxide is formed as an oxygen of an oxide high dielectric diffuses through the platinum lower electrode and then reacts with Ti of lower limb TiN layer, the phenomena occur that the platinum film swells up and it peels off at the interface with TiN.

According to the conventional art, the method for manufacturing a capacitor of a semiconductor device has problems that the characteristic and the reliability of a semiconductor device are reduced since the characteristic of device is deteriorated due to the unnecessary reaction between a contact plug and an electrode. Furthermore, the productivity of a semiconductor device is reduced, and therefore, it becomes difficult to integrate the semiconductor device in a large scale.

SUMMARY OF THE INVENTION

It is an object of the present invention to provide a method for manufacturing a capacitor of semiconductor device, which improves the characteristic and reliability of semiconductor device wherein enabling large scale integration of semiconductor device by controlling the deterioration phenomenon of a diffusion barrier film caused from the thermal process which improves the electrical characteristic of the capacitor.

The method for manufacturing a capacitor of a semiconductor device in accordance with the present invention comprises the steps of providing a semiconductor substrate; forming an intermediate insulating film having a contact plug on the semiconductor substrate; forming a tungsten nitride film as an diffusion barrier film on the intermediate insulating film including the contact plug; and forming a stack structure of a lower electrode, a dielectric film and an upper electrode on the tungsten nitride film.

In accordance with another aspect of the present invention, a method for manufacturing a capacitor of semiconductor device comprises the following steps of: providing a semiconductor substrate; forming an intermediate insulating film having a contact plug on the semiconductor substrate; forming a tungsten nitride film as a diffusion barrier film on the intermediate insulating film including the contact plug, wherein the tungsten nitride film is formed by plasma enhanced chemical vapor deposition method using a $WF_6$—$H_2$—$N_2$ based reactant; and forming a stack structure of a lower electrode, a dielectric layer and an upper electrode on the tungsten nitride film.

The principle of the present invention to achieve the above object is that the dielectric film is formed out of ferroelectric materials such as tantalum oxide film of high permittivity having high dielectric constant Er (Ta2O5), BST (Ba, Sr) film, PZT (PbZrTiO3) film, SBT (SrBi2Ta2O9) film, BTO (Bi4Ti3O12) film or PLZT (PbLaZrTiO3) film.

When the dielectric film is formed out of the ferroelectric materials and if the tungsten nitride film is used as the diffusion barrier film for the lower electrode material and the polysilicon plug, since the tungsten nitride film forms a thin silicide layer between the tungsten nitride film and the polysilicon in the high temperature process such as an oxide dielectric anneal process or a BPSG insulation film formation process which are the following processes after the lower electrode is formed, the destruction of diffusion protection film due to the tension stress does not occur.

Also, since the tungsten nitride film has an excellent property as a diffusion barrier film, the reaction of silicide between the electrode and the polysilicon can be controlled and therefore problems of conventional art can be solved.

The above and further objects, aspects and novel features of the present invention will become more apparent from the following detailed description when read in connection with the accompanying drawings.

DESCRIPTION OF THE PREFERRED EMBODIMENT

Figure 1:
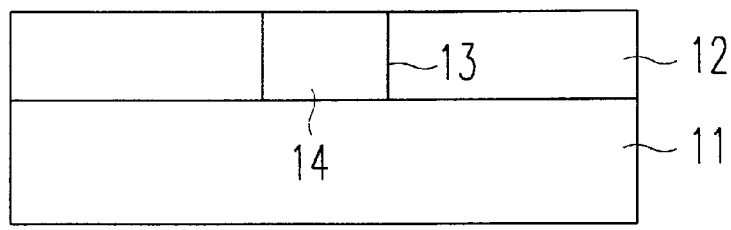
FIGS. 1 to 3 are cross sectional views showing the manufacturing processes of a capacitor of a semiconductor device in accordance with an embodiment of the present invention.

The method for manufacturing a capacitor of a semiconductor device is described as follows. As shown in FIG. 1, first of all, device separation insulation film (not shown), word line (not shown) and bit line (not shown) are formed on the semiconductor substrate 11, and an intermediate insulating film 12 is formed on the surface of entire structure, thereby makes the planarization of the entire structure. At the moment, the intermediate insulating film 12 is formed out of an insulating film which has excellent fluidity such as BPSG oxide film.

Thereafter, a contact hole 13 is formed by etching the intermediate insulating film 12 using an etch process which uses a storage electrode contact mask (not shown). And a contact plug 14 is formed by filling the contact hole 13 with polysilicon.

Figure 2:
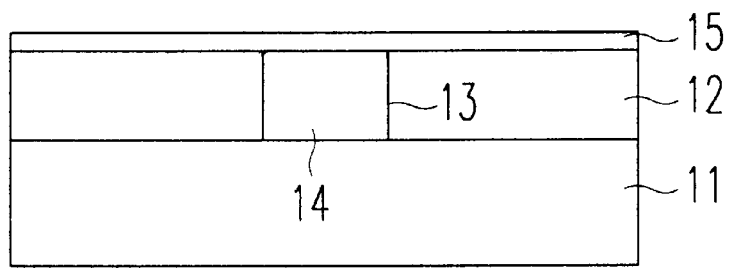

Then, as shown in FIG. 2, a tungsten nitride film 15 as a diffusion barrier film is formed on the surface of entire structure and has the thickness of 100–600 Å using PECVD method.

Here, the tungsten nitride film 15 can be formed by the PECVD method, using the WF6-H2-N2 based gas. For example, the tungsten nitride film 15 can be formed by flowing the WF6 gas in the N2-H2 plasma at the temperature of 250–450° C. At the moment, the composition ratio and structure of the thin film can be changed by controlling the flux ratio of nitrogen and hydrogen. For example, if the flux ratio of nitrogen to hydrogen is 0.25–1, tungsten-rich (W-rich) tungsten nitride (WNx: 0.5<X<0.9) can be obtained.

Then, the surplus tungsten reacts on the polysilicon which is a contact plug in the following thermal process during high temperatures and then an uniformly and thin tungsten silicide (not shown) are formed on the interface between the contact plug 14 and the tungsten nitride film 15.

Figure 3:
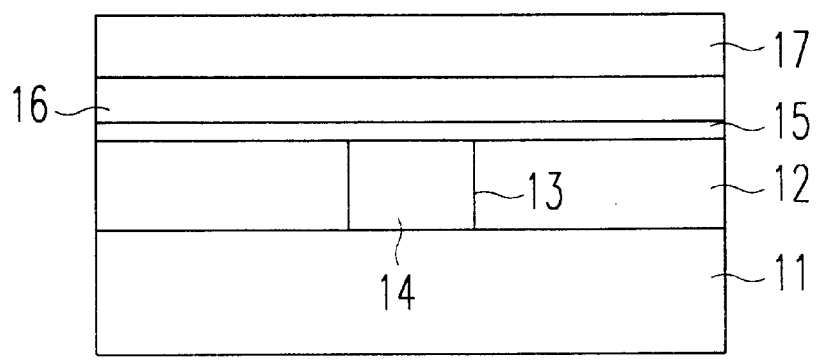

As shown in FIG. 3, a lower electrode 16 is formed on the tungsten nitride film 15, and a dielectric film 17 is formed on the lower electrode 16 using a ferroelectric material.

As following processes, an upper electrode (not shown) is formed on the dielectric film 17, and then the capacitor is completed with etch process using a capacitor mask.

The method for manufacturing a capacitor of a semiconductor device in accordance with the present invention can improve the characteristic and reliability of semiconductor device wherein enabling large scale integration of semiconductor device by using the tungsten nitride film as the anti-diffusion film protecting the deterioration property of anti-diffusion film caused from the thermal process.

What is claimed is:

1. A method for manufacturing a capacitor of a semiconductor device, the method comprising:
    a) providing a semiconductor substrate;
    b) forming an intermediate insulating film having a contact plug on the semiconductor substrate;
    c) forming a tungsten-rich tungsten nitride film as a diffusion barrier film on the intermediate insulating film having the contact plug; and
    d) forming, on the tungsten-rich tungsten nitride film, a stack structure including:
        1) a lower electrode;
        2) a dielectric layer; and
        3) an upper electrode.

2. The method of claim 1, wherein:
    the tungsten-rich tungsten nitride film is deposited by a PECVD method using $WF_6$—$H_2$—$N_2$ based gas as a reaction material.

3. The method of claim 1, wherein:
    the tungsten-rich tungsten nitride $WN_x$ film has a composition range of 0.5<X<0.9 by controlling a flux ratio of nitrogen to hydrogen as 0.25–1.

4. The method of claim 1, wherein:
    the tungsten-rich tungsten nitride film has a thickness of 100–600 Å.

5. The method of claim 1, wherein:
    the tungsten-rich tungsten nitride film is formed at a temperature of 250–450° C.

6. The method of claim 1, wherein:
    the lower electrode uses Pt or a conductive oxide film such as $RuO_2$ or $IrO_2$ selectively.

7. The method of claim wherein:
    the dielectric film is selected from a group consisting of PZT, SBT, SBNO and BTO.

8. A method for manufacturing a capacitor of a semiconductor device, the method comprising:
    a) providing a semiconductor substrate;
    b) forming an intermediate insulating film having a contact plug on the semiconductor substrate;
    c) forming a tungsten-rich tungsten nitride $WN_x$ film as a diffusion barrier film on the intermediate insulating film having the contact plug, wherein the tungsten-rich tungsten nitride film has a composition range of 0.5<X<0.9 by controlling a flux ratio of nitrogen to hydrogen as 0.25–1; and
    d) forming, on the tungsten-rich tungsten nitride film, a stack structure including:
        1) a lower electrode;
        2) a dielectric layer; and
        3) an upper electrode.

9. The method of claim 8, wherein:
    the tungsten-rich tungsten nitride film has a thickness of 100–600 Å.

10. The method of claim 8, wherein:
    the tungsten-rich tungsten nitride film is formed at a temperature of 250–450° C.

11. The method of claim 8, wherein:
    the lower electrode uses Pt or a conductive oxide film such as $RuO_2$ or $IrO_2$ selectively.

12. The method of claim 8, wherein:
    the dielectric film is selected from a group consisting of PZT, SBT, SBNO and BTO.

13. A method for manufacturing a capacitor of a semiconductor device, the method comprising:
    a) providing a semiconductor substrate;
    b) forming an intermediate insulating film having a contact plug on the semiconductor substrate;
    c) forming a tungsten nitride $WN_x$ film as a diffusion barrier film on the intermediate insulating film having the contact plug, wherein the tungsten nitride film has a composition range of 0.5<X<0.9 by controlling a flux ratio of nitrogen to hydrogen as 0.25–1;
    d) forming a tungsten silicide film on an interface between the contact plug and the tungsten nitride film; and
    e) forming, on the tungsten nitride film, a stack structure including:

1) a lower electrode;
2) a dielectric layer; and
3) an upper electrode.

14. The method of claim 13, wherein:
the tungsten nitride film has a thickness of 100–600 Å.

15. The method of claim 13, wherein:
the tungsten nitride film is formed at a temperature of 250–450° C.

16. The method of claim 13, wherein:
the lower electrode uses Pt or a conductive oxide film such as $RuO_2$ or $IrO_2$ selectively.

17. The method of claim 13, wherein:
the dielectric film is selected from a group consisting of PZT, SBT, SBNO and BTO.

* * * * *